(12) United States Patent
Yamada et al.

(10) Patent No.: US 9,702,905 B2
(45) Date of Patent: Jul. 11, 2017

(54) PROBE UNIT

(75) Inventors: Yoshio Yamada, Nagano (JP); Makoto Yumino, Nagano (JP); Mitsuhiro Kondo, Nagano (JP); Satoshi Shoji, Nagano (JP)

(73) Assignee: NHK Spring Co., Ltd., Yokohama-shi (JP)

( * ) Notice: Subject to any disclaimer, the term of this patent is extended or adjusted under 35 U.S.C. 154(b) by 79 days.

(21) Appl. No.: 14/236,388

(22) PCT Filed: Jul. 31, 2012

(86) PCT No.: PCT/JP2012/069502
§ 371 (c)(1),
(2), (4) Date: Jan. 31, 2014

(87) PCT Pub. No.: WO2013/018809
PCT Pub. Date: Feb. 7, 2013

(65) Prior Publication Data
US 2014/0247065 A1 Sep. 4, 2014

(30) Foreign Application Priority Data

Aug. 2, 2011 (JP) .................................. 2011-169613

(51) Int. Cl.
*G01R 1/067* (2006.01)
*G01R 31/28* (2006.01)

(52) U.S. Cl.
CPC ..... *G01R 1/06722* (2013.01); *G01R 1/06738* (2013.01); *G01R 31/2886* (2013.01)

(58) Field of Classification Search
CPC ............ G01R 1/06722; G01R 1/06738; G01R 31/2886; G01R 1/067; G01R 1/06755; G01R 31/04

(Continued)

(56) References Cited

U.S. PATENT DOCUMENTS 6,159,056 A * 12/2000 Boyle ................ G01R 1/06722
439/700
6,208,155 B1 * 3/2001 Barabi ................ G01R 1/0466
324/750.25

(Continued)

FOREIGN PATENT DOCUMENTS

JP   62-140459 U    9/1987
JP   2003-234161 A  8/2003

(Continued)

OTHER PUBLICATIONS

International Search Report dated Aug. 28, 2012, issued for PCT/JP2012/069502.

(Continued)

*Primary Examiner* — Thang Le
(74) *Attorney, Agent, or Firm* — Locke Lord LLP

(57) ABSTRACT

The probe unit includes probe groups of two or more contact probes to be in contact with one electrode of a contact target body on a side of one end in a longitudinal direction and the respective contact probes are to be in contact with separate electrodes of a board on a side of another end. The contact probe includes an end portion arranged on the side of one end, having nail portions in a tapered end shape, and brought into contact with the one electrode at the nail portions; a second contact unit arranged on the side of another end, and to be in contact with a corresponding electrode of the board; and a coil spring arranged between the end portion and the second contact unit, and biasing the end portion and the second contact unit.

4 Claims, 5 Drawing Sheets

(58) Field of Classification Search
USPC ............ 324/754.08, 12, 13, 14, 18, 755.01, 324/755.04, 755.05, 756.01, 756.02, 324/756.04, 756.05
See application file for complete search history.

(56) References Cited

U.S. PATENT DOCUMENTS

| | | | | |
|---|---|---|---|---|
| 6,655,983 | B1 * | 12/2003 | Ishikawa | G01R 1/07314 324/755.01 |
| 7,025,602 | B1 * | 4/2006 | Hwang | H01R 13/2421 439/66 |
| 7,862,391 | B2 * | 1/2011 | Johnston | H01R 13/2421 439/66 |
| 7,946,855 | B2 * | 5/2011 | Osato | H01R 13/2421 324/755.05 |
| 8,344,747 | B2 * | 1/2013 | Kazama | G01R 1/07371 324/755.01 |
| 8,373,430 | B1 * | 2/2013 | Sochor | H01R 13/2421 29/874 |
| D699,607 | S * | 2/2014 | Nakamura | D10/80 |
| 9,128,120 | B2 * | 9/2015 | Lee | G01R 1/067 |
| 2008/0042676 | A1 * | 2/2008 | Yamada | G01R 1/07314 324/754.05 |
| 2010/0052707 | A1 * | 3/2010 | Nakayama | G01R 31/2889 324/754.07 |
| 2010/0219852 | A1 * | 9/2010 | Yamada | G01R 1/06722 324/756.03 |
| 2010/0271061 | A1 * | 10/2010 | Yamamoto | G01R 1/06722 324/754.03 |
| 2012/0182036 | A1 | 7/2012 | Yamamoto et al. | |
| 2014/0162503 | A1 * | 6/2014 | Yamada | H01R 4/4863 439/786 |

FOREIGN PATENT DOCUMENTS

| | | | | |
|---|---|---|---|---|
| JP | 2004-271290 | A | | 9/2004 |
| JP | 2004271290 | A * | 9/2004 | ............ G01R 1/073 |
| JP | 2005249447 | A | | 9/2005 |
| JP | 2008045986 | A | | 2/2008 |
| JP | 2008-096368 | A | | 4/2008 |
| JP | 2008096368 | A * | | 4/2008 |
| JP | 2009-074963 | A | | 4/2009 |
| JP | WO2011036935 | | * | 3/2011 |
| JP | 2012149927 | A | | 8/2012 |
| WO | 2011013383 | A1 | | 2/2011 |

OTHER PUBLICATIONS

Notice of Rejection mailed on Mar. 21, 2017 issued for corresponding Japanese Patent Application No. 2013-526937.

* cited by examiner

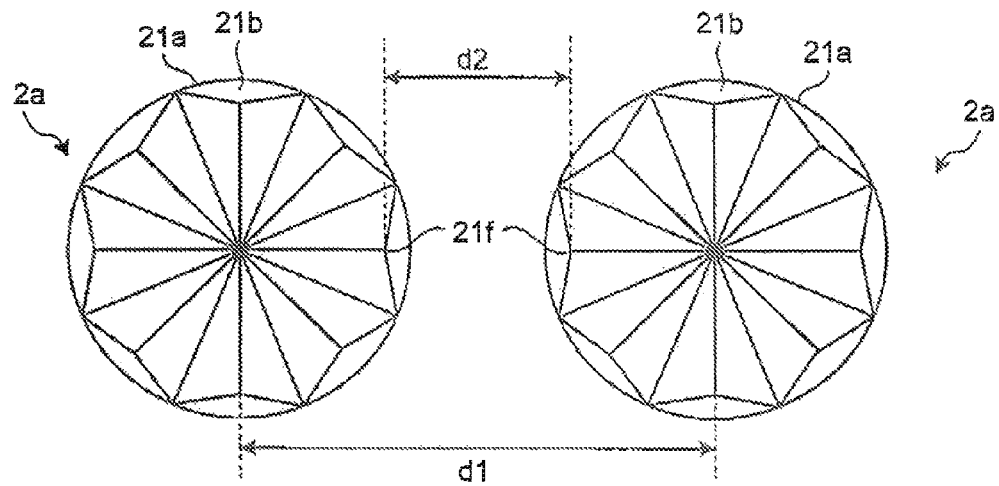
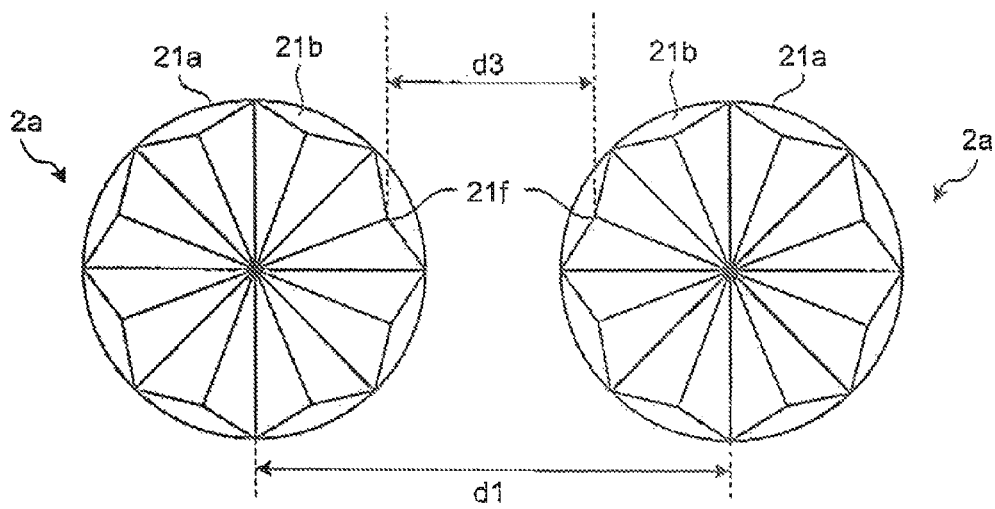

PROBE UNIT

FIELD

The present invention relates to a probe unit that is used in a continuity test or a performance characteristics test of a test subject such as a semiconductor integrated circuit and a liquid crystal panel.

BACKGROUND

Conventionally, when a continuity test or a performance characteristics test of a test subject such as a semiconductor integrated circuit and a liquid crystal panel is performed, a probe unit that accommodates multiple contact probes has been used to obtain electrical connection between the test subject and a signal processing device that outputs test signals. For the probe unit, with the recent progression of high integration and miniaturization of semiconductor integrated circuits and liquid crystal panels, a technique applicable to highly integrated and miniaturized test subjects has been improved by narrowing pitches between contact probes.

As a continuity test or a performance characteristics test of a test subject such as a semiconductor integrated circuit and a liquid crystal panel there is four-terminal measurement. As this four-terminal measurement, a manufacturing method of a probe unit is disclosed (for example, refer to Patent Literature 1) that measures electric characteristics with a set of contact probes (probe group) held by a guide plate by bringing the end of each contact probe into contact with a contact target (subject of measurement).

The contact probe disclosed in Patent Literature 1 comes into contact respectively with leads at one end, and comes into contact with a contact target at the other end. The probe group is brought into contact with the contact target at the same time, and thereby performs four-terminal measurement. According to Patent Literature 1, by differing diameters of the respective contact probes in a direction perpendicular to a direction of insertion to the guide plate, the contact probes are efficiently arranged.

CITATION LIST

Patent Literature

Patent Literature 1: Japan Patent Application Laid-open No. 2009-74963

SUMMARY

Technical Problem

Contact targets have various shapes, and are in, for example, a hemispherical shape, a spindle shape, or a flat plate shape. In the case of a hemispherical contact target, if four-terminal measurement is performed using the contact probes disclosed in Patent Literature 1, when two contact probes having a flat end to be in contact with the contact target are brought into contact therewith, at least one of the contact probes is shifted from the center of the hemispherical shape. Therefore, the contact probe slides off on the surface of the contact target and can fall off from the contact target. When the contact probe falls off the contact target, there can be a case in which secure continuity cannot be established with the contact target.

The present invention is achieved in view of the above problem, and an object of the present invention is to provide a probe unit that is capable of establishing secure continuity with a contact target.

Solution to Problem

To solve the problem described above and achieve the object, a probe unit according to the present invention includes a plurality of probe groups each including two or more contact probes to be in contact with one electrode of a contact target body on a side of one end in a longitudinal direction, the respective contact probes being to be in contact with separate electrodes of a board on a side of another end, wherein the contact probe includes: a first contact unit that is arranged on the side of one and in the longitudinal direction, that has a plurality of nail portions having a tapered end shape, and that is brought into contact with the electrode of the contact target body at the nail portions; a second contact unit that is arranged on the side of another end in the longitudinal direction, and that is to be in contact with corresponding electrode of the board; and a coil spring that is arranged between the first contact unit and the second contact unit, and that biases the first and the second contact units.

Moreover, in the probe unit according to the present invention as set forth in the invention described above, the first contact unit has four or more pieces of the nail portions.

Moreover, in the probe unit according to the present invention as set forth in the invention described above, the first contact unit has 6 to 10 pieces of the nail portions.

Advantageous Effects of Invention

The probe unit according to the present invention is arranged such that two contact probes that come in contact with the same electrode at a side of one end, and that come in contact respectively with separate electrodes on a side of the other end are configured to be in contact with the electrode on the side of one end respectively at end portions having multiple nail portions, and thereby produces an effect that secure continuity with a contact target can be achieved.

BRIEF DESCRIPTION OF DRAWINGS

FIG. 4 is a diagram showing a configuration of an essential part of the probe unit according to the embodiment of the present invention.

FIG. 5 is a diagram showing a configuration of an essential part of the probe unit according to the embodiment of the present invention.

DESCRIPTION OF EMBODIMENTS

Embodiments of the present invention are explained in detail with reference to the accompanying drawings. The present invention is not limited to the embodiments below. Moreover, the respective drawings to be referred to in the following explanation show a shape, size, and positional relation only schematically so as to be understand contents of the present invention. That is, the present invention is not limited only to the shapes size, and positional relation shown in the respective drawings.

Figure 1:
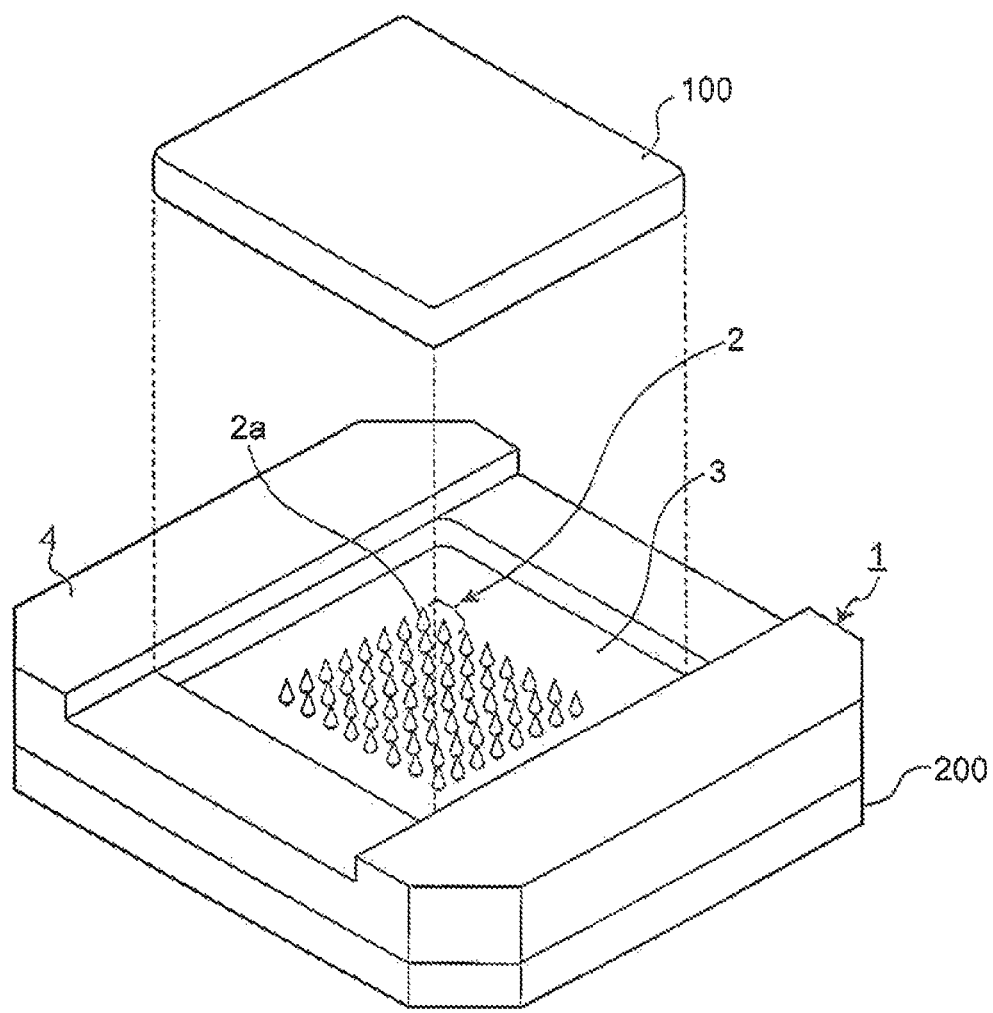
FIG. 1 is a perspective view showing a configuration of a probe unit according to an embodiment of the present invention.

FIG. 1 is a perspective view showing a configuration of a probe unit 1 according to an embodiment of the present invention. The probe unit 1 shown in FIG. 1 is a device used when electric characteristics test of a semiconductor integrated circuit 100, which is a test subject (contact target), is performed, and is a device that electrically connects between the semiconductor integrated circuit 100 and a circuit board 200 that outputs test signals to the semiconductor integrated circuit 100.

The probe unit 1 includes probe groups 2 having two or more (two in the present embodiment) contact probes 2a (hereinafter, simply "robes 2a") that are brought into contact with one electrode of the semiconductor integrated circuit 100 being a contact target on a side of one end in the longitudinal direction, and are brought into contact respectively with separate electrodes of the circuit board 200 on a side of the other end, a probe holder 3 that accommodates and holds the probe groups 2 according to a predetermined pattern, and a holder member 4 that is arranged around the probe holder 3, and that suppress misalignment of the semiconductor integrated circuit 100 that is to be in contact with the probe groups 2 at the test.

Figure 2:
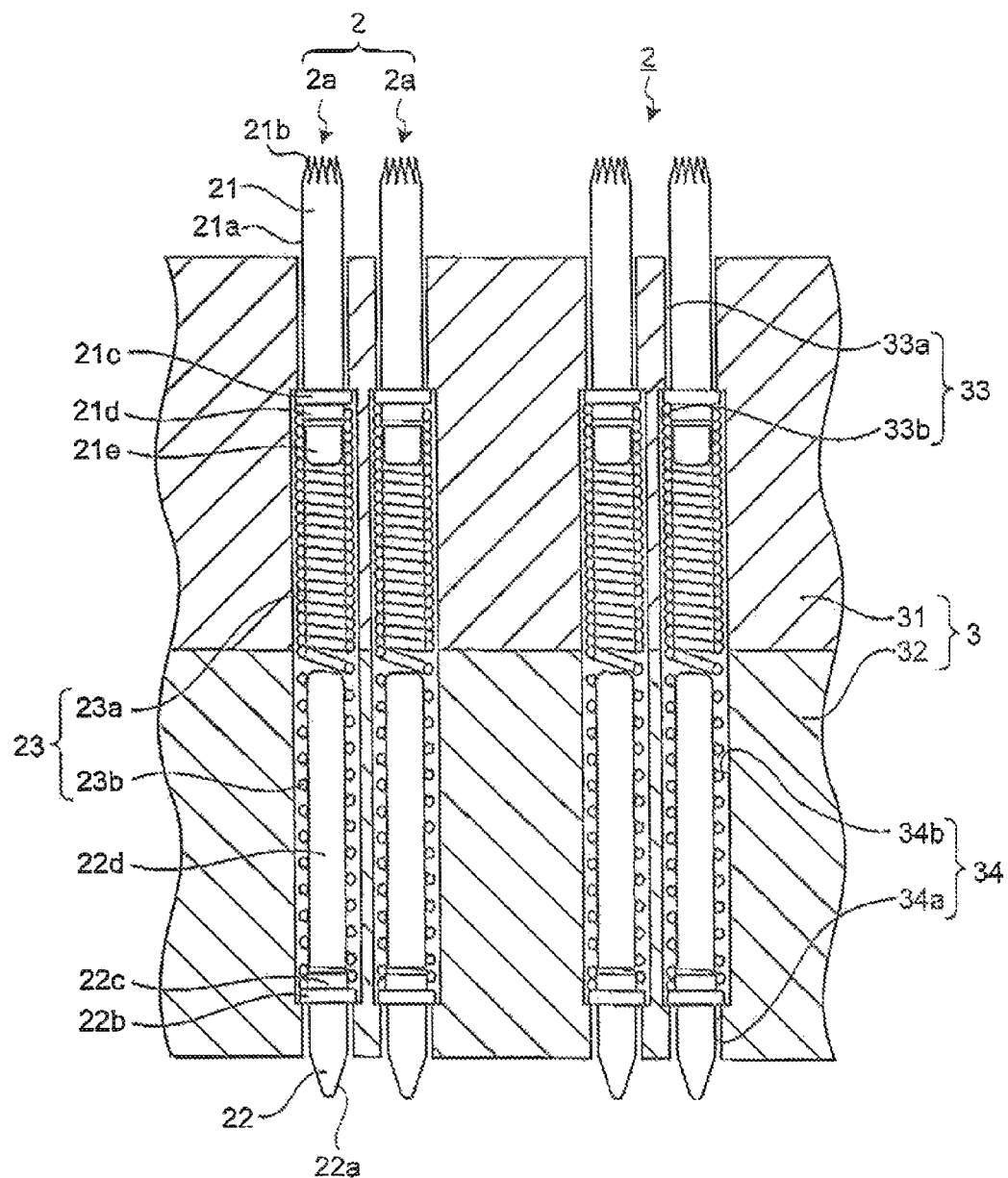
FIG. 2 is a partial cross-section stowing a configuration of an essential part of the probe unit according to the embodiment of the present invention.

FIG. 2 is a diagram showing a detailed configuration of the probe group 2 that is accommodated in the probe holder 3. In the probe group 2 shown in FIG. 2, two units of the probes 2a formed with an electrically conductive material are arranged in parallel such that the heights thereof align. The probe 2a includes a first plunger 21 that comes in contact with a connection electrode of the semiconductor integrated circuit 100 when a test of the semiconductor integrated circuit 100 is performed, a second plunger 22 that comes in contact with an electrode of the circuit board 200 having a test circuit, and a coil spring 23 that is arranged between the first plunger 21 and the second plunger 22 and that expandably connects the first plunger 21 and the second plunger 22. The first plunger 21, the second plunger 22, and the coil spring 23 constituting the probe 2a have the same axis. In the probe 2a, when brought into contact with the semiconductor integrated circuit 100, the coil spring reduces a shock on the connection electrode of the semiconductor integrated circuit 100 by expanding and contracting in the direction of axis, and applies a load on the semiconductor integrated circuit 100 and the circuit board 200.

The first plunger 21 includes an end portion 21a (first contact unit) that has multiple nail portions 21b having a tapered end shape, a flange portion 21c that extends from a base end side of the end portion 21a and has a large diameter compared to the diameter of the end portion 21a, a boss portion 21d that extends from an end of the flange portion 21c different from an end connected to the end portion 21a and has a small diameter compared to the diameter of the flange portion 21c, and a base end portion 21e that extends from an end of the boss portion 21d different from an end connected to the flange portion 21c and has approximately identical diameter to the diameter of the boss portion 21d, coaxially. Furthermore, the base end portion 21e has an R-chamfered end.

The second plunger 22 includes an end portion 22a having a tapered end shape, a flange portion 22b that extends from a base end side of the end portion 22a and has a large diameter compared to the diameter of the end portion 22a, a boss portion 22c that extends from an end of the flange portion 22b different from an end connected to the end portion 22a and has an approximately identical diameter to the diameter the boss portion 21d, and a base end portion 22d that extends from an end of the boss portion 22c different from an end connected to the flange portion 22b, and that has a diameter approximately identical to the diameter of the boss portions 21d, 22c, coaxially. This second plunger 22 can be moved in a direction of axis by the action of expansion and contraction of the coil spring 23, and is biased toward the circuit board 200 by the elasticity of the coil spring 23 to be brought into contact with the electrode of the circuit board 200. A second contact unit corresponds to the end portion 22a and the flange portion 22b.

In the coil spring 23, the first plunger 21 side is a tight wound section 23a wound in a diameter approximately identical to the diameter of the boss portion 21d, and on the other hand, the second plunger 22 side is a rough wound section 23b wound in a predetermined pitch in a diameter equal to or larger than the diameter of the base end portion 22d. An end of the tight wound section 23a abuts against the flange portion 21c being pressed by the boss portion 21d, for example, when the internal diameter is approximately identical to that of the boss portion 21d. On the other hand, an end of a rough wound section 23d is pressed by the boss portion 22c and abuts against the flange portion 22b. It is preferable that the tight wound section 23a and the rough wound section 23b be wound such that the internal diameters are identical. The first plunger 21 and the second plunger 22 and the coil spring may be connected by soldering.

For a wire material used for the coil spring a conductive metal having such a spring property (stroke) that a contraction amount of the rough wound section 23b larger than the minimum distance between the base end portion 22d and the tight wound section 23a when an initial load is applied, for example, in a state in which the probe 2a is accommodated in the probe holder 3 (see FIG. 1) is used by using the coil spring 23 having such a spring property, the base end portion 22d is slid into the tight wound section 23a so as to abut thereto when a predetermined load is applied to the probe 2a, and thereby electrical continuity is established between the base and portion 22d and the tight wound. Section 23a.

The probe holder 3 is formed using a insulating material such as resins, machinable ceramics, and silicon, and is formed such that a first member 31 positioned on a top surface side in FIG. 2 and a second member 32 positioned on a bottom surface side are layered. In the first member 31 and the second member 32, the same number of holder holes 33 and 34 to hold multiple probes 2a are formed, and the holder holes 33 and 34 to hold the probes 2a are formed such that respective axis coincide with each other. Positions of the holder holes 33 and 34 are determined according to a wiring pattern of the semiconductor integrated circuit 100.

The holder holes 33 and 34 both have a stepped hole shape that has different diameters along the direction of a hole piercing through. That is, the holder hole 33 is constituted of a small diameter section 33a having an opening on an upper end surface of the probe holder 3 and a large diameter section 33b having a diameter larger than that of this small diameter section 33a. The small diameter section 33a has a little larger diameter compared to the diameter of the end portion 21a. Moreover, the large diameter section 33b has a little larger diameter compared to the diameter of the flange portion 21c and/or the coil spring 23.

On the other hand, the holder hole 34 is constituted of a small diameter section 34a having an opening on a lower end surface of the probe holder 3, and a large diameter section 34b having a diameter larger than that of this small diameter section 34a. The small diameter section 34a has a little larger diameter compared to that of the end portion 22a. Moreover, the large diameter section 34b has a little larger diameter compared to the diameter of the flange portion 22b and/or the diameter of the coil spring 23. The shapes of these holder holes 33 and 34 are determined according to a structure of the probe 2a to be accommodated therein.

The flange portion 21c of the first plunger 21 has a function of preventing the probe 2a from falling off the probe holder 3 by abutting on a wall of a boundary between the small diameter section 33a and the large diameter section 33b of the holder hole 33. Furthermore, the flange portion 22b of the second plunger 22 has a function of preventing the probe 2a from falling off the probe holder 3 by abutting on a wall of a boundary between the small diameter section 34a and the large diameter section 34b of the holder hole 34. The walls of the respective boundaries of the holder holes 33 and 34 can be formed in a stepped shape corresponding to the diameters of the flange portions 21c, 22b, and the coil spring 23, respectively.

Figure 3:
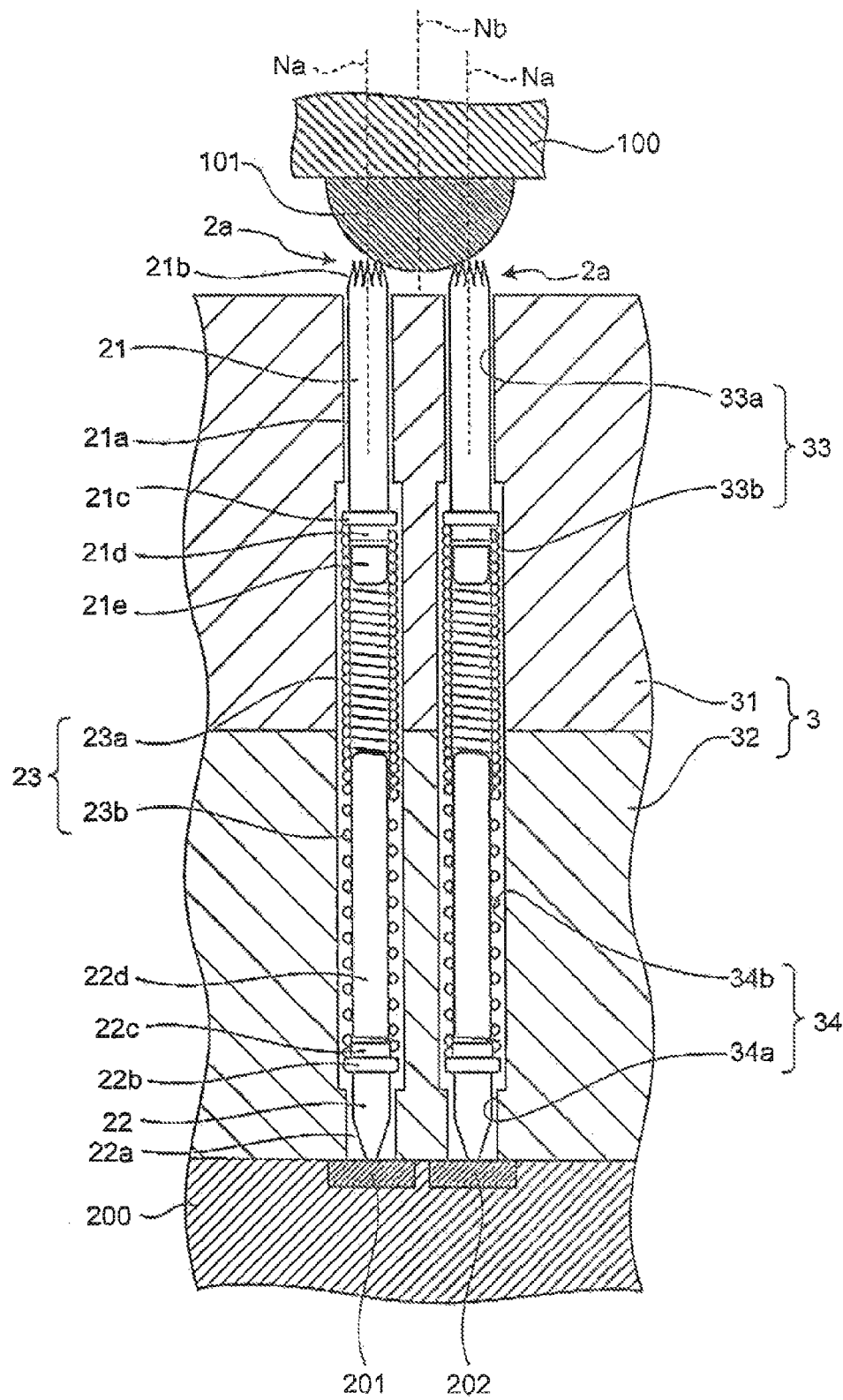
FIG. 3 is a partial cross-section showing a configuration of an essential part of the probe unit at a test of a semiconductor integrated circuit according to the embodiment of the present invention.

FIG. 3 is a diagram showing a state of the semiconductor integrated circuit 100 at a test using the probe holder 3. During a test of the semiconductor integrated circuit 100, the coil spring 23 is in a state in which the coil spring 23 is contracted in the longitudinal direction by a contact load from the semiconductor integrated circuit 100. When the coil spring 23 contracts, the base end portion 22d of the second plunger 22 enters into the tight wound section 23a to slide and abut on an inner peripheral side of the tight wound section 23a. At this time, because the axis of the second plunger 22 does not deviate greatly, contact between the base end portion 22d and the inner periphery of the tight wound section 23a is stable, and because the tight wound section 23a slightly meanders, contact resistance between the base end portion 22d and the coil spring 23 becomes stable, and thereby, secure continuity can be achieved.

A test signal that is supplied, from the circuit board 200 to the semiconductor integrated circuit 100 at a test reaches a connection electrode 101 of the semiconductor integrated circuit 100 from electrodes 201, 202 of the circuit board 200 through the probes 2a, respectively. Specifically, in the probe 2a, the signal reaches the connection electrode 101 of the semiconductor integrated circuit 100 through the second plunger 22, the tight wound section 23a, and then the first plunger 21. As described, in the probe 2a, because the first plunger 21 and the second plunger 22 are in conduction through the tight wound section 23a, a conduction path of electric signals can be minimized. Therefore, it is possible prevent a signal from flowing into the rough wound section 23b during a test, and reduction and stabilization of an inductance can be achieved. As for the two electrodes 201, 202, for example, the electrode 201 is an electrode for measurement (Sense) and the electrode 202 is an electrode for power transmission (Force).

Furthermore, because ends of the nail portions 21b are tapered, even if an oxide film is formed on a surface of the connection electrode 101, the end of the nail portion 21b can be brought into direct contact with the connection electrode 101 breaking through the oxide film. The respective probes 2a are made contact with the connection electrode 101 such that center axes Na of the probes 2a are shifted from an axis Nb that passing through the center of the connection electrode 101 in a hemispherical shape. As for the arrangement of the probes 2a, it is preferable that the center axes Na be positioned on the axis Nb side relative to a rim (outer edge) of the connection electrode 101 at a side facing the semiconductor integrated circuit 100.

The nail portions 21b are arranged in plurality along an outer edge of the end portion 21a, and a top of either one comes into contact with the surface of the connection electrode 101. It is preferable that four or more pieces of the nail portions 21b be arranged with regions for forming the nail portions 21b equally dividing an end surface in a direction perpendicular to a direction in which the end portion 21a extends, at an end of the end portion 21a.

FIGS. 4 and 5 are top views schematically showing a configuration of the end portions 21a of the probes 2a. FIG. 4 is a diagram showing a state in which a distance between tops 21f of the nail portions 21b is close in the two probes 2a. FIG. 5 is a diagram showing a state in which a distance between the tops 21f of the nail portions 21b is maximized in the two probes 2a. Explanation is given assuming the number of the nail portions 21b arranged at the end portions 21a is eight in FIGS. 4 and 5. Moreover, a distance between the center axes Na (see FIG. 3) of the two end portions 21a is referred to as d1 in FIGS. 4 and 5.

As shown in FIG. 4, a distance when the distance between the tops 21f of the nail portions 21b is minimized is referred to as d2. Furthermore, as shown in FIG. 5, a distance when the distance between the tops 21f of the nail portions 21b are maximized is referred to as d3. The distance d2 shown in FIG. 4 is determined by a diameter in a direction perpendicular to the longitudinal direction of the end portion 21a and/or arrangement positions of the two probes 2a. To acquire stable contact with the connection electrode 101, it is preferable that this distance d2 be as small as possible.

On the other hand, as shown in FIG. 5, when the end portions 21a (the probe 2a), rotate (rotate 22.5° in the case of the eight nail portions 21b) about the center axes Na from the position of the nail portions 21b in FIG. 4, the distance between the nail portions 21b becomes large. This distance d3 is determined by the diameter in a direction perpendicular to the longitudinal direction of the end portion 21a and/or the arrangement positions of the two probes 2a, and can vary depending on the number of the nail portions 21b arranged at the end portions 21a.

Figure 6:
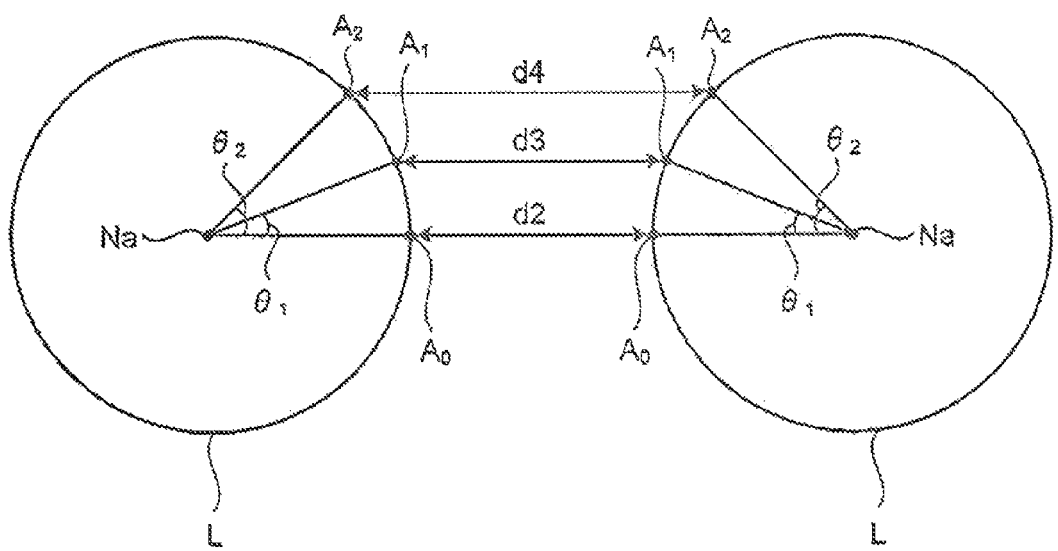
FIG. 6 is a schematic diagram showing a path of tops of nail portions of contact probes in the probe unit according to the embodiment of the present invention.

The distance between the tops 21f of the two nail portions 21b can be considered as a distance between points on paths L along which the tops 21f pass when the end portions 21a rotate about the center axes Na. At this time, for example, as shown in FIG. 6, assuming that the tops 21f pass along the paths L by rotation of the end portions 21a, positions at which the respective tops 21f of the two probes 2a come closest to each other (positions at which a line joining the respective center axes Na and the paths L intersect with each other) are referred to as $A_0$. Furthermore, positions to which the tops 21f shift when rotated by an angle $\theta_1$ (for example, $\theta_1=22.5°$) from these positions $A_0$ are referred to as $A_1$. Positions to which the tops 21f shift when rotated by an angle $\theta_2$ (for example, $\theta_2=45°$) from the positions $A_0$ are referred to as $A_2$. At this time, a distance between the positions $A_2$ is referred to as d4. In this case, as is obvious from FIG. 6, as a rotation angle $\theta$ ($0°<\theta\leq90°$) becomes larger, the distance between the separate tops 21f becomes larger (d2<d3<d4).

For example, when the number of the nail portions 21b is four, in the two probes 2a, from the positions at which the tops 21f of the respective nail portions 21b are closest to each other to positions at which the tops 21f are farthest from each other, the end portions 21a are supposed to rotate about the center axes Na by 45°. The distance between the respective tops 21f at the positions ($A_2$) of the rotation angle 45° is large compared to the distance between the respective tops 21f at the positions ($A_1$) of the rotation angle 22.5° (the number of the nail portions 21b is eight).

Accordingly, the more the nail portions 21b are arranged, the smaller the maximum distance between the tops 21f of the nail portions 21b of the two probes 2a becomes, and further stable contact state to the connection electrode 101 can be maintained. On the contrary, if too many pieces of the nail portions 21b are arranged, in the end portions 21a having a diameter that can be used in the present embodiment of, for example, approximately 100 μm, an area that can be used for a single piece of the nail portion 21b with respect to this diameter is to be small, and durability of the respective nail portions 21b to contact with the connection electrode 101 can be deteriorated. Therefore, it is preferable that the nail portions 21b according to the present embodiment be arranged at the end portions 21a in the number of 6 to 10.

According to the embodiment described above, in four-terminal measurement, the two probes 2a that are to be in contact with the same electrode of the connection electrode 101 on a aside of one end, and are to be in contact respectively with the separate electrodes 201, 202 on a side of the other end are arranged to come into contact with the connection electrode 101 with each of the end portions 21a having multiple pieces of the nail portions 21b, and therefore, secure continuity with a contact target can be achieved.

Furthermore, by arranging multiple numbers of nail portions at end, portions on a contact side with a connection electrode, even if a nail portion to which a foreign material is attached, at an end thereof by contamination and the like or a nail portion considerably worn out is included, possibility of presence of other nail portions that do not have such influence increases, and therefore, contact stability can be improved for a damaged end portion compared to conventional probes.

Moreover, by arranging multiple numbers of nail portions at end portions on a contact side with a connection electrode, even if a contact position of a probe and a connection electrode is deviated, one or more nail portions including a nail portion adjacent to a nail portion that is supposed to come into contact originally are brought into contact with the connection electrode, and therefore, stable contact between the probes and the connection electrode is enabled.

Furthermore, by arranging multiple numbers of nail portions at end portions on a contact side with a connection electrode, a current value at contact with the connection electrode is distributed, and a heating value at each nail portion decreases, and therefore, contact resistance generated between the probes and the connection electrode can be reduced.

Although in the embodiment described above, explanation is given assuming that a connection electrode is in a hemispherical shape, it can be a lead in a plate shape that is used in QFP (quad flat package) and the like. Also when the probes are brought into contact with a contact surface of the lead, by bringing multiple nail portions into contact therewith, a contact area can be more invariant compared to plate-to-plate contact as a conventional case, and therefore, stable contact between the probes and the connection electrode can be achieved.

Moreover, ends of respective flange portions on respective end portion sides and respective walls at boundaries between a large diameter section and a small diameter section can be formed in a tapered shape. This enables to perform positioning of a probe in a direction perpendicular to a direction of axis when the probe is attached to a holder can be performed further reliably.

Although it has been explained that the second contact unit corresponds to the end portion 22a and the flange portion 22b, when attached as a part of the probe unit 1 as shown in FIG. 1, it can be configured such that the second contact unit is only the flange portion 22b, and an end of the flange portion 22b comes into contact with an electrode.

Furthermore, although for a holding unit (holder holes) to hold one set of the probes 2a of the probe group 2, it has been explained that an inner wall (a part of the first member 31 and the second member 32) between the holder holes 33 and 34 is arranged, it can be configured such that an inner wall is not arranged between the holder holes 33 and 34, and apart of the first plunder 21, a part of the second plunger 22, and the Coil spring 23 of the respective probes 2a are held in a connected space.

The probe 2a used in the probe group 2 is not limited to be configured with a plunger and a coil spring, and can configured with a pogo pin or a wire probe that acquires a load by bending a wire.

INDUSTRIAL APPLICABILITY

As described, a probe unit according to the present invention is useful for acquiring secure continuity with a contact target.

REFERENCE SIGNS LIST

1 PROBE UNIT
2 PROBE GROUP
2a CONTACT PROBE (PROBE)
3 PROBE HOLDER
4 HOLDER MEMBER
21 FIRST PLUNGER
21a, 22a END PORTION
21b NAIL PORTION
21c, 22b FLANGE PORTION
21d, 22c BOSS PORTION
21e, 22d BASE END PORTION
22 SECOND PLUNGER
23 SPRING COIL
23a TIGHT WOUND SECTION
23b ROUGH WOUND SECTION
31 FIRST MEMBER
32 SECOND MEMBER
33, 34 HOLDER HOLE
33a, 34a SMALL DIAMETER SECTION
33b, 34b LARGE DIAMETER SECTION
100 SEMICONDUCTOR INTEGRATED CIRCUIT
101 CONNECTION ELECTRODE
200 CIRCUIT BOARD
201, 202 ELECTRODE

The invention claimed is:

1. A probe unit comprising a plurality of probe groups each including two or more contact probes to be in contact with one electrode of a contact target body on a side of one end in a longitudinal direction, the respective contact probes being to be in contact with separate electrodes of a board on a side of another end, wherein the contact probe comprises:
a first contact unit that is arranged on the side of one end in the longitudinal direction, that has a plurality of nail portions having a tapered end shape, and that is brought into physical contact with the electrode of the contact target body by at least two of the plurality of the nail portions positioned on a side near other contact probe contacting the same electrode;

a second contact unit that is arranged on the side of another end in the longitudinal direction, and that is to be in contact with a corresponding electrode of the board; and a coil spring that is arranged between the first contact unit and the second contact unit, and that biases the first and the second contact units, wherein the first contact unit is brought into contact with the electrode of the contact target body by at least two of the plurality of the nail portions that are located where a clockwise or counterclockwise rotation angle from a position at which the plurality of contact probes come closest each other is less than 45 degrees.

2. The probe unit according to claim 1, wherein the first contact unit has four or more pieces of the nail portions.

3. The probe unit according to claim 1, wherein the first contact unit has 6 to 10 pieces of the nail portions.

4. The probe unit according to claim 2, wherein the first contact unit has 6 to 10 pieces of the nail portions.

\* \* \* \* \*